United States Patent
Ranjan et al.

(10) Patent No.: US 9,881,807 B2
(45) Date of Patent: Jan. 30, 2018

(54) METHOD FOR ATOMIC LAYER ETCHING

(71) Applicant: Tokyo Electron Limited, Tokyo (JP)

(72) Inventors: Alok Ranjan, Mechanicville, NY (US);
Sonam Sherpa, Albany, NY (US);
Mingmei Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/083,363

(22) Filed: Mar. 29, 2016

(65) Prior Publication Data

US 2016/0293432 A1 Oct. 6, 2016

Related U.S. Application Data

(60) Provisional application No. 62/139,795, filed on Mar. 30, 2015.

(51) Int. Cl.
*H01L 21/302* (2006.01)
*H01L 21/3065* (2006.01)
*H01J 37/32* (2006.01)

(52) U.S. Cl.
CPC .... *H01L 21/3065* (2013.01); *H01J 37/32963* (2013.01)

(58) Field of Classification Search
CPC ............ H01L 21/3065; H01L 21/0228; H01L 21/02164; H01L 21/0217; H01L 21/02312;

(Continued)

(56) References Cited

U.S. PATENT DOCUMENTS

2002/0146511 A1* 10/2002 Chiang ............... C23C 16/0227
427/248.1
2011/0139748 A1* 6/2011 Donnelly .......... H01J 37/32036
216/37

(Continued)

OTHER PUBLICATIONS

Lim, Woong Sun, et al., "Atomic layer etching of graphene for full graphene device fabrication," 50 Carbon pp. 429-435 (2012).

(Continued)

*Primary Examiner* — Lan Vinh
(74) *Attorney, Agent, or Firm* — Wood Herron & Evans LLP

(57) ABSTRACT

A method of etching a layer on a substrate includes disposing a substrate in a plasma processing system configured to facilitate an etching process, performing an atomic layer etching process cycle to etch a monolayer of an exposed surface of the substrate, and repeating the atomic layer etching process cycle until a target depth is reached. Each process cycle etches the monolayer from the exposed surface. The atomic layer etching process cycle sequentially includes forming an adsorption monolayer comprising an etchant on an exposed surface of the substrate by introducing the etchant while concurrently coupling electromagnetic power to the plasma processing system at a power level targeted to achieve an etchant radical flux at the substrate greater than a total ion flux at the substrate, which power level is less than or equal to 50 W, purging the plasma processing system to remove any excess etchant, desorbing the adsorption monolayer by exposing the adsorption monolayer to gas ions to activate a reaction of the etchant, and purging the plasma processing system again.

20 Claims, 14 Drawing Sheets

(58) Field of Classification Search
CPC .......... H01L 21/31144; C23C 16/45544; H01J 37/32972; H01J 37/32935; H01J 37/32963
USPC ....... 438/695, 697, 706, 710, 712, 714, 719, 438/720, 736
See application file for complete search history.

(56) References Cited

U.S. PATENT DOCUMENTS

| | | | |
|---|---|---|---|
| 2011/0192820 A1 | 8/2011 | Yeom et al. | |
| 2013/0084707 A1 | 4/2013 | Hashimoto et al. | |
| 2014/0113457 A1* | 4/2014 | Sims | H01L 21/02167 438/792 |
| 2014/0120738 A1* | 5/2014 | Jung | H01L 21/02219 438/778 |
| 2014/0206192 A1 | 7/2014 | Yeom et al. | |
| 2015/0083582 A1* | 3/2015 | Dhindsa | H01L 21/3065 204/192.37 |

OTHER PUBLICATIONS

Sakaue, Hiroyuki, et al., "Atomic Layer Controlled Digital Etching of Silicon," 29 Japanese Journal of Applied Physics, pp. 2648-2652 (1990).

U.S. Patent and Trademark Office, International Search Report and Wirtten Opinion in PCT/US2016/024661, dated Jun. 30, 2016 (13 pages).

Athavale, S.D. and Economou, D.J., "Molecular Dynamics Simulation of Atomic Layer Etching of Silicon," Journal of Vacuum Science & Technology A 13, 966, Mar. 13, 1995, 7 pages.

Athavale, S.D. and Economou, D.J., "Realization of Atomic Layer Etching of Silicon," Journal of Vacuum Science & Technology B 14, 3702, Aug. 17, 1996, 5 pages.

Taiwan Intellectual Property Office, Notification of Examination Opinions issued in counterpart TW Patent Application No. 105109945 dated Apr. 5, 2017, 13 pp., including English translation.

* cited by examiner

METHOD FOR ATOMIC LAYER ETCHING

CROSS-REFERENCE TO RELATED APPLICATIONS

This application is related and claims priority to U.S. Provisional Patent Application Ser. No. 62/139,795 filed on Mar. 30, 2015, the entire contents of which are herein incorporated by reference.

FIELD OF INVENTION

The invention relates to a method for patterning a layer, and more specifically, to a method for etching a layer.

DESCRIPTION OF RELATED ART

The need to remain competitive in cost and performance in the production of semiconductor devices elevates demand to continually increase the device density of integrated circuits. And, to achieve higher degrees of integration with the miniaturization in semiconductor integrated circuitry, robust methodologies are required to reduce the scale of the circuit pattern formed on the semiconductor substrate. These trends and requirements impose ever-increasing challenges on the ability to transfer the circuit pattern from one layer to another layer.

Photolithography is a mainstay technique used to manufacture semiconductor integrated circuitry by transferring geometric shapes and patterns on a mask to the surface of a semiconductor wafer. In principle, a light sensitive material is exposed to patterned light to alter its solubility in a developing solution. Once imaged and developed, the portion of the light sensitive material that is soluble in the developing chemistry is removed, and the circuit pattern remains.

Furthermore, to advance optical lithography, as well as accommodate the deficiencies thereof, continual strides are being made to establish alternative patterning strategies to equip the semiconductor manufacturing industry for sub-30 nm technology nodes. Optical Lithograph (193i) in conjunction with multiple patterning, EUV (Extreme Ultraviolet) Lithography, and DSA (Direct Self Assembly) Patterning are considered to be some of the promising candidates that are being evaluated to meet the rising demands for aggressive patterning.

Another exemplary lithographic technique that may prove beneficial for the miniaturization of semiconductor integrated circuitry is Atomic Layer Etching (ALE). In ALE, the substrate to be etched is chemically treated with an etchant to affect only the top atomic layer. After a purging step to remove excess etchant, an etching step removes the chemically treated top atomic layer. The cycle of chemical modification and etching is repeated to remove one monolayer at a time until the desired depth of the etched feature is reached. An exemplary process is the reaction of silicon wafer top layers with chlorine, followed by an argon plasma removal of the chlorinated top layers.

In concert with advanced patterning techniques, including optical and EUV lithography, advanced, highly selective etching techniques are required to transfer sub-30 nm features. Additionally, advanced etching schemes are needed that meet requirements for profile control, anisotropy, and rate, among other things.

SUMMARY OF THE INVENTION

Embodiments of the invention relate to a method for patterning a layer, and more specifically, to a method for etching a layer.

According to one embodiment, a method of etching a layer on a substrate is described. A method of etching a layer on a substrate includes disposing the substrate in a plasma processing system configured to facilitate an etching process, performing an atomic layer etching process cycle to etch a monolayer of an exposed surface of the substrate, and repeating the atomic layer etching process cycle until a target depth is reached. Each process cycle etches the monolayer from the exposed surface. The atomic layer etching process cycle sequentially includes forming an adsorption monolayer comprising an etchant on an exposed surface of the substrate by introducing the etchant while concurrently coupling electromagnetic power to the plasma processing system at a power level targeted to achieve an etchant radical flux at the substrate greater than a total ion flux at the substrate, which power level is less than or equal to 50 W, purging the plasma processing system to remove any excess etchant, desorbing the adsorption monolayer by exposing the adsorption monolayer to gas ions to activate a reaction of the etchant, and purging the plasma processing system again.

In a further embodiment of the present invention, a method of etching a substrate includes disposing the substrate in a plasma processing system configured to facilitate an etching process and etching an exposed surface of the substrate one monolayer of substrate material per process cycle. Each process cycle comprises alternatingly performing an adsorption step and a desorption step. The adsorption step includes adsorbing an etchant on the exposed surface of the substrate while coupling electromagnetic power to the plasma processing system at a power level less than or equal to 50 W to achieve an etchant radical flux at the exposed surface greater than a total ion flux at the exposed surface and the desorption step includes activating a reaction between the adsorbed etchant and the monolayer of substrate material to desorb a reaction product.

DETAILED DESCRIPTION OF SEVERAL EMBODIMENTS

Figure 1:
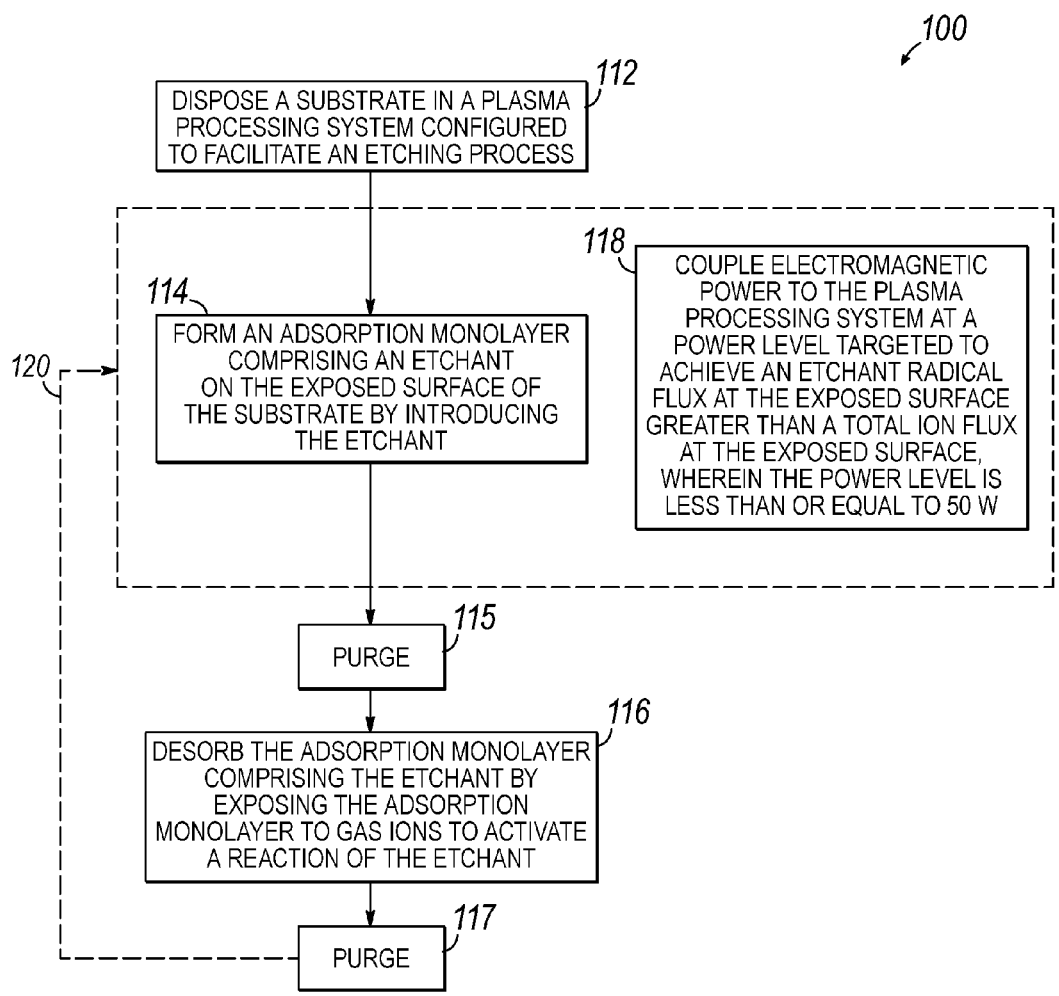
FIG. 1 provides a flow chart illustrating a method of etching a layer on a substrate according to an embodiment.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiments. Various additional operations may be performed and/or described operations may be omitted in additional embodiments.

As used herein, the term "radiation sensitive material" includes, but is not necessarily limited to, photosensitive materials such as photoresists.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, the substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

As noted above, advanced methodologies are required to address the challenges and meet the demands for aggressive patterning at sub-30 nm technology nodes. And, as also noted, these methodologies present their own set of challenges, which manifest as issues with etch selectivity, rate, and profile control. The ability to successfully integrate patterning schemes with highly selective etch processes is paramount to robust pattern transfer.

As an example, once the circuit pattern is initially formed, the patterned material serves as a protective layer that masks some regions of the semiconductor substrate, while other regions are exposed, to permit transfer of the circuit pattern to an underlying layer utilizing a dry etching process, such as a plasma etch process. The patterned material may be a photosensitive material patterned using optical lithography, a mechanically imprinted patterned layer, or a direct self-assembled layer, among other things. In order to produce thinner features in the initial patterned layer, multi-layer schemes, such as bi-layer masks or tri-layer masks, can be implemented. With the inclusion of a second or third layer, the uppermost patterned layer may be thinner than the thickness customarily chosen to withstand the subsequent dry etching process(es). Therefore, the demands placed upon subsequent dry etching techniques are elevated.

In a plasma etch process, the semiconductor substrate is exposed to an etching chemistry that selectively removes the underlying layer while minimally removing the protective layer. This etch chemistry derives from an ionizable, dissociative gas mixture having atomic/molecular constituents capable of favorable reaction with the underlying layer while minimizing less favorable reaction with the protective layer. In the presence of plasma, the etch chemistry is formed through the interaction, e.g., collisions, of its atomic/molecular constituents with energetic electrons, of which some collisions are dissociative collisions and others are ionizing collisions, for example. Via complex mechanisms, the plasma is manipulated to achieve acceptable values for several inter-related etch metrics, including etch selectivity, etch rate, and profile, among other things. And, as noted above, with ever-decreasing pattern scale, the ability to selectively remove one material relative to another while satisfactorily meeting other pattern metrics (e.g., roughness, defectivity, etc.) becomes only more critical to robust pattern transfer. Notably, the etch selectivity of subsequent dry etching processes must preserve the lithographic layer to allow full pattern transfer to underlying layers. Furthermore, while etch selectivity is of great concern, the pattern integrity (e.g., roughness, defectivity, etc.) must also be maintained, and more preferably, improved.

Figure 2A:
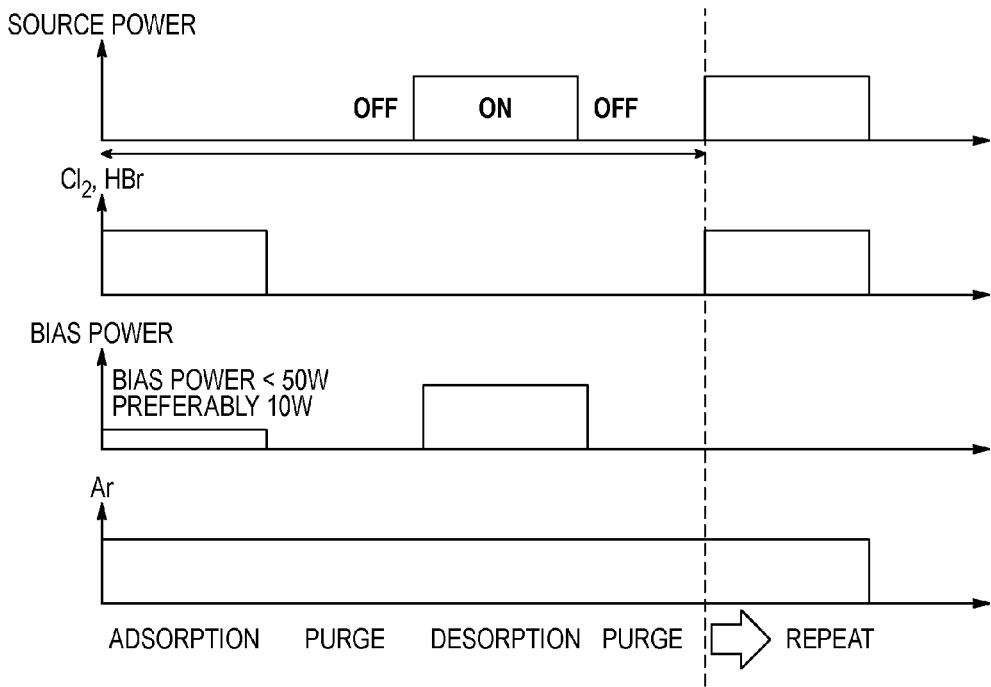
FIGS. 2A and 2B illustrate a method of etching a layer on a substrate.
Figure 2B:
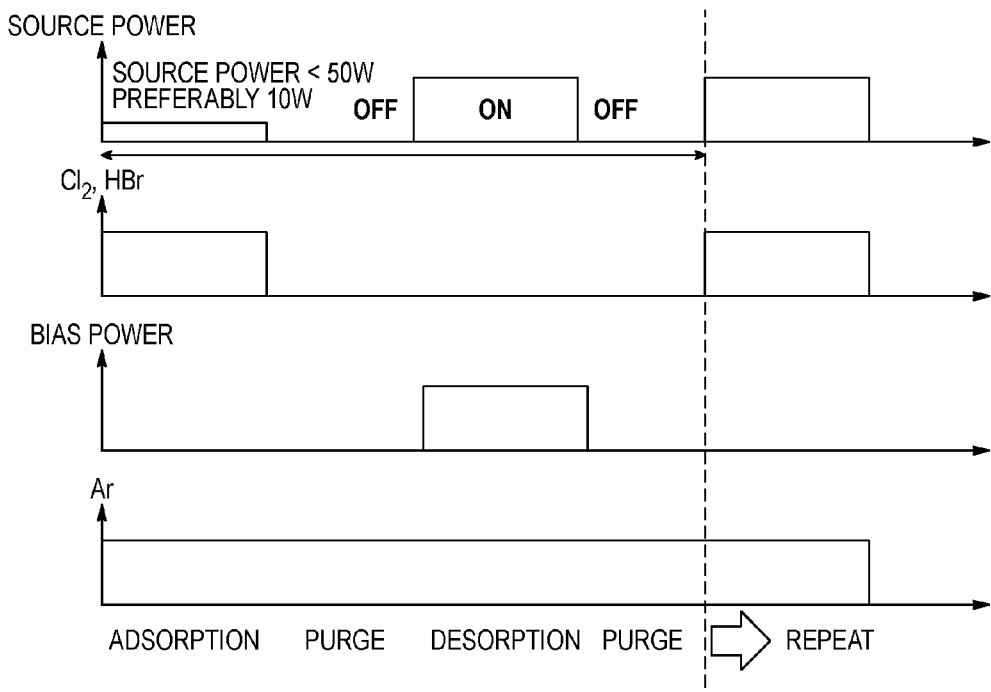

Referring now to the drawings, wherein like reference numerals designate identical or corresponding parts throughout the several views, FIGS. 1, 2A, and 2B illustrate a method for etching a layer on a substrate according to an embodiment. The method is pictorially illustrated in FIGS. 2A and 2B, and presented by way of a flow chart 100 in FIG. 1. As presented in FIG. 1, the flow chart 100 begins in 112 with disposing a substrate in a plasma processing system configured to facilitate an etching process.

The substrate can include a patterned layer having a layer to be etched or patterned. The patterned layer can define an open feature pattern overlying one or more additional layers. The substrate further includes device layers. The device layers can include any thin film or structure on the substrate into which a pattern is to be transferred. For example, the device layers may include silicon-containing antireflective coatings ("SiARCs").

The substrate can include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, and VI refer to the classical or old IUPAC notation in the Periodic Table of Elements; according to the revised or new IUPAC notation, these Groups would refer to Groups 2, 13, 15, and 16, respectively). The substrate can be of any size, for example, a 200 mm (millimeter) substrate, a 300 mm substrate, a 450 mm substrate, or an even larger substrate. The device layers can include any film or device structure into which a pattern can be transferred.

In 114, an adsorption monolayer comprising an etchant is formed on an exposed surface of the substrate by introducing the etchant, for example, for a first pulse period. The etchant can include a halogen-containing gas, such as a halogen (e.g., $Cl_2$, $F_2$, $Br_2$), a halide (HBr), a halomethane, a halosilane, a fluorocarbon, or a hydrofluorocarbon, among others (see FIGS. 2A, 2B). For example, the etchant may include $Cl_2$, $Br_2$, $F_2$, HBr, $BCl_3$, $SF_6$, $NF_3$, a fluorocarbon compound of the form $C_xF_y$, wherein x and y are real numbers greater than zero, a fluorohydrocarbon compound of the form $C_xF_yH_z$ wherein x, y and z are real numbers greater than zero, or any combination of two or more thereof.

In 115, the plasma processing system is purged to remove any excess etchant present.

In 116, the adsorption monolayer is desorbed by exposing the adsorption monolayer to gas ions, i.e., plasma, to activate a reaction of the etchant, for example, for a second pulse period. The source gas for the gas ions can include a noble gas, such as Ar, Ne, and/or He, for example, or any other element, such as N, O, C, H, etc. The second pulse period may be 3 seconds or less. For instance, the second pulse period may be 2 seconds or 1 second or any fractional part thereof.

The gas ions may be formed by flowing the source gas into the plasma processing system and coupling electromagnetic power to the plasma processing system as bias power coupled to a substrate holder upon which the substrate rests and as source power to an electrode opposing and facing the substrate holder to strike and maintain a plasma of the source gas. The gas ions bombard the exposed surface of the substrate containing the adsorption monolayer with energy sufficient to activate a reaction between the adsorbed atoms and atoms of substrate material at the exposed surface to desorb a reaction product, thereby removing the monolayer. By way of example, and not limitation, the bias power may be on the order of 150 W, while the source power is on the order of 2500 W.

In 117, the plasma processing system is purged once again, this time to remove the desorbed adsorption monolayer.

In 118, concurrently with forming the adsorption monolayer in 114, electromagnetic power is coupled to the plasma processing system during the first pulse period at a power level targeted to achieve an etchant radical flux at the substrate greater than a total ion flux at the substrate. The power level may be less than or equal to 50 W. In one embodiment, the power level is targeted to achieve a ratio of the etchant radical flux to the total ion flux at the substrate that exceeds a value of 100. In another embodiment, the power level is targeted to achieve a ratio of the etchant radical flux to the total ion flux at the substrate that exceeds a value of 1000.

The electromagnetic power in 118 may be coupled to the plasma processing system at least in part as bias power coupled to the substrate holder upon which the substrate rests. Further, the electromagnetic power may be exclusively applied as such a bias power. Additional electromagnetic power may be coupled to the plasma processing system as source power to the electrode opposing and facing the substrate holder. Alternatively, the sole source of electromagnetic power may be source power on the opposing electrode. The electromagnetic power in 118 during formation of the adsorption monolayer in 114, whether applied as bias power, source power, or both, is significantly less than the power applied to form the gas ions in 116 during desorption of the monolayer.

In 120 and as shown in FIGS. 2A and 2B, the exposed surface of the substrate is etched one reaction layer, or monolayer, per process cycle by alternatingly repeating forming the adsorption monolayer in 114 and desorbing the adsorption monolayer in 116 until a target depth is reached. In accordance with the embodiments of the invention, the adsorption step in 114 includes low EM power for achieving an etchant radical flux at the substrate greater than a total ion flux at the substrate, while the desorption step in 116 includes high EM power for forming plasma to expose the substrate to ion energy sufficient to activate a reaction and desorb a reaction product. The alternating steps may include pulsed, or alternating, gas flow between the etchant gas and the source gas for the ions. For example, in the illustrations of FIGS. 2A and 2B, the Ar flow may be turned off during the adsorption step, and pulsed on during the desorption step, rather than the continuous flow that is depicted. Alternatively, as shown, the Ar gas may flow continuously throughout the process cycle, to serve as a purge gas and as the source gas for the desorption step. The continuous flow may be at the same flow rate, or may include a lower flow rate during adsorption and a higher flow rate during desorption. For continuous flow, the source gas should be non-reactive, such as a noble gas, to the substrate and the etchant during the adsorption step, such that a desorption reaction is only activated upon powering on the source and bias power at sufficiently high level to form plasma in the desorption step of the process cycle.

By way of example only, and not limitation, the total number of process cycles may range from 1 cycle to 100 cycles or from 10 cycles to 90 cycles or from 20 cycles to 80 cycles or from 30 cycles to 70 cycles. In some embodiments, the total number of etch cycles may be 50 cycles or 40 cycles or 30 cycles or any whole number of cycles therebetween. As each cycle removes a monolayer of material from the substrate, the number of cycles to be repeated is determined by the target depth to which the surface is to be etched. The rate at which the substrate is etched, i.e., the etch rate, may be determined. In certain embodiments, the etch rate is greater than 1 Å/s. For instance, the etch rate may be 1.1 Å/s, 1.2 Å/s, 1.3 Å/s, 1.4 Å/s, 1.5 Å/s, or even greater. In at least one embodiment, the etch rate is in excess of 1.3 Å/s.

Figure 3A:
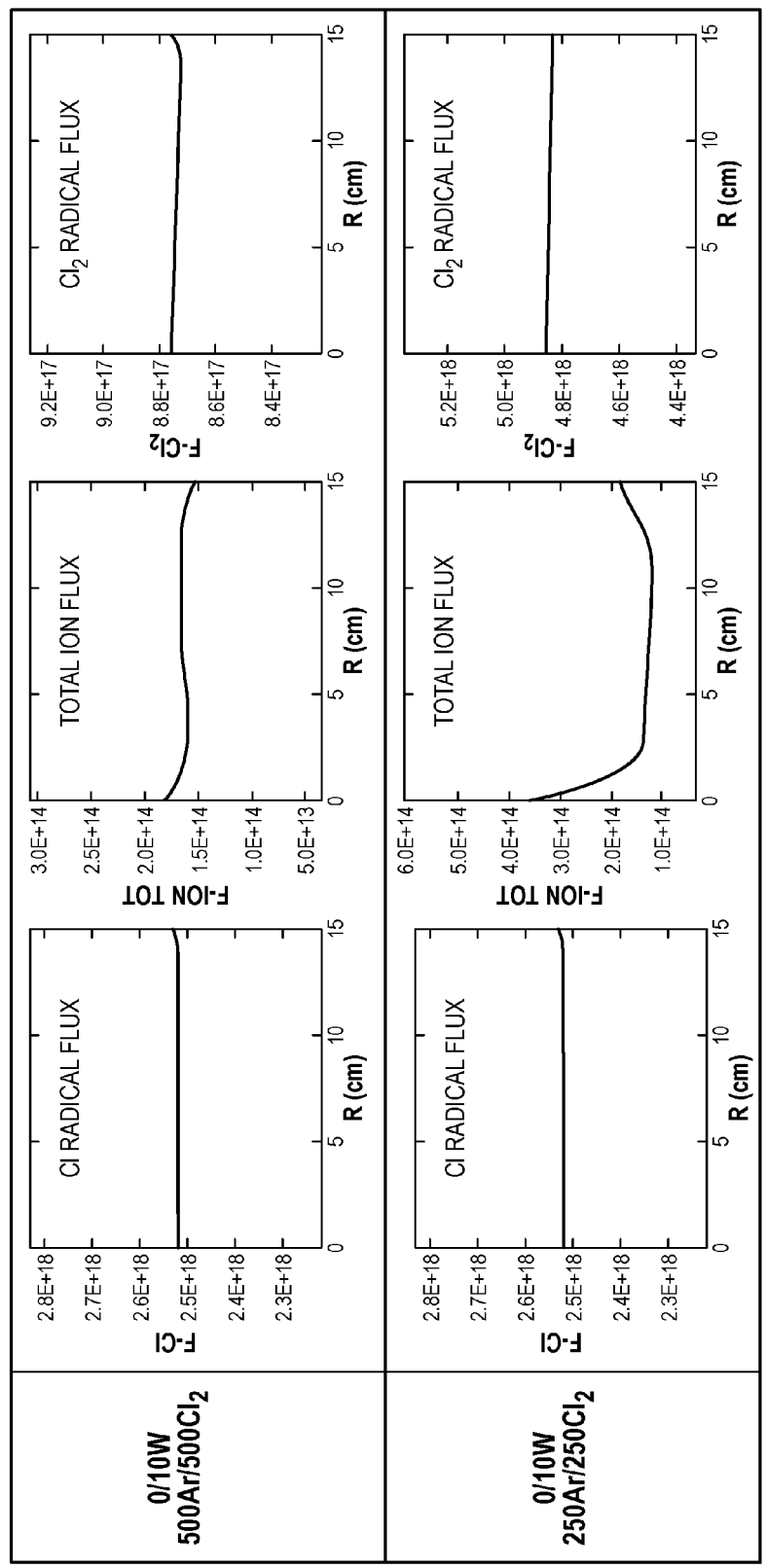
FIGS. 3A through 3C provide exemplary data for etching a layer on a substrate according to an embodiment.
Figure 3B:
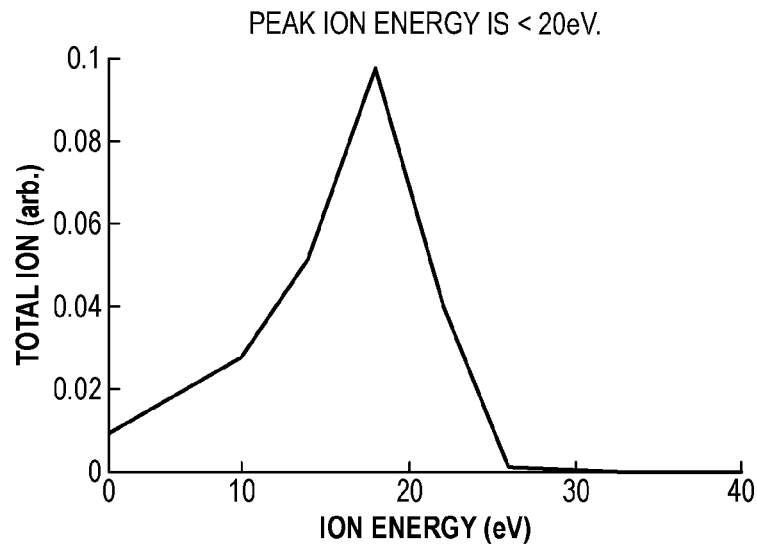
Figure 3C:
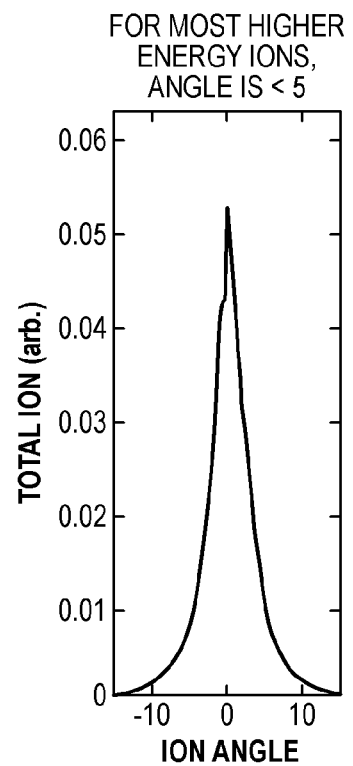

When the applied EM power is under a low power condition (e.g., less than 50 W, 40 W, 30 W, 20 W, 10 W, etc.), the adsorption of the etchant is very fast. Without being bound by theory, the inventors have determined that the radical flux is greater than the ion flux under this process condition (see FIG. 3A), and adsorption can take place at an elevated rate due, in part, to this increased radical flux relative to the ion flux at the substrate surface. The ratio of the radical flux to the ion flux at the substrate surface can be greater than 100, or even 1000. Furthermore, the process conditions can create low ion energy (e.g., less than 20 eV), and a relatively narrow ion energy angular distribution (e.g., less than 5 degrees) (see FIGS. 3B, 3C).

Throughout the process, a vacuum may be applied to the plasma processing system. For instance, a vacuum may be applied while forming the adsorption monolayer and/or desorbing the adsorption monolayer. In some embodiments, the pressure within the plasma processing system may be 100 mTorr or less. For instance, the pressure within the plasma processing system may be about 60 mTorr or less.

When the etchant includes a halogen-containing material, halogenation of the surface to be etched occurs quickly, i.e in less than 2 seconds or less than 1 second or even less than 0.5 second (see FIGS. 4A-4E). Of course, the halogenation may occur in any fractional part of the time values listed above. When both adsorption and desorption cycles are performed, the etch amount is substantially greater than the etch amount when either an adsorption cycle alone or a desorption cycle alone is performed (see FIG. 4F).

Figure 4A:
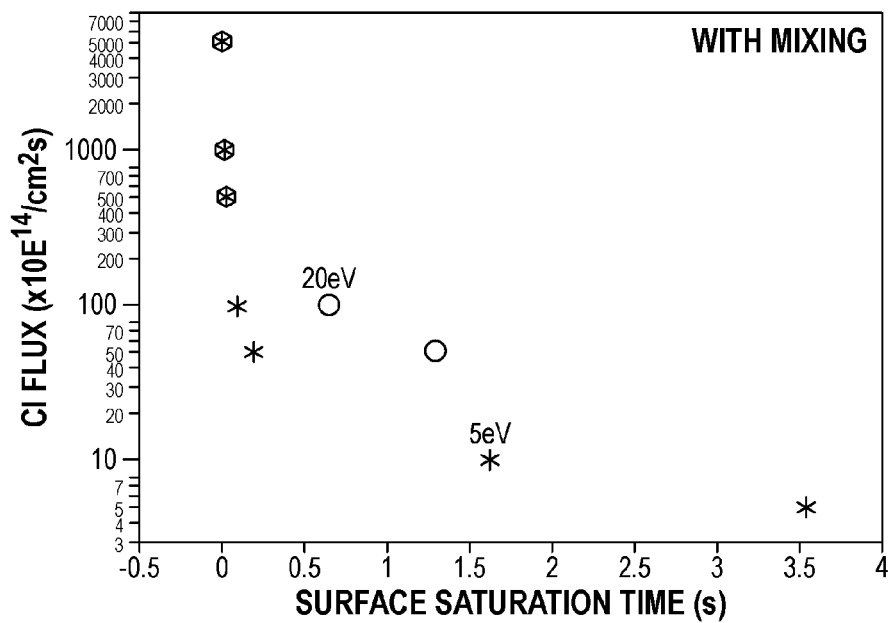
FIGS. 4A through 4F provide exemplary data for etching a layer on a substrate according to various embodiments.
Figure 4B:
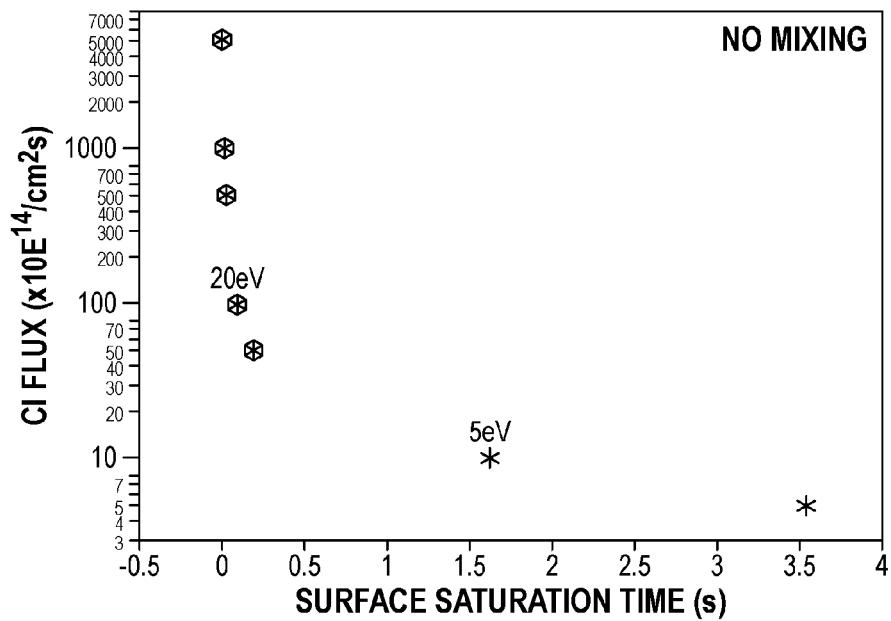
Figure 4C:
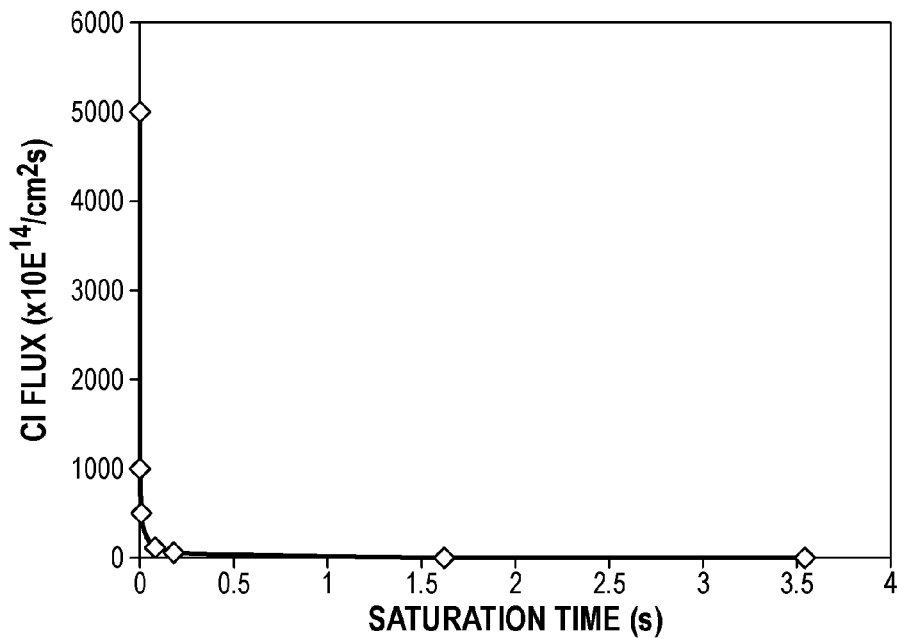
Figure 4D:
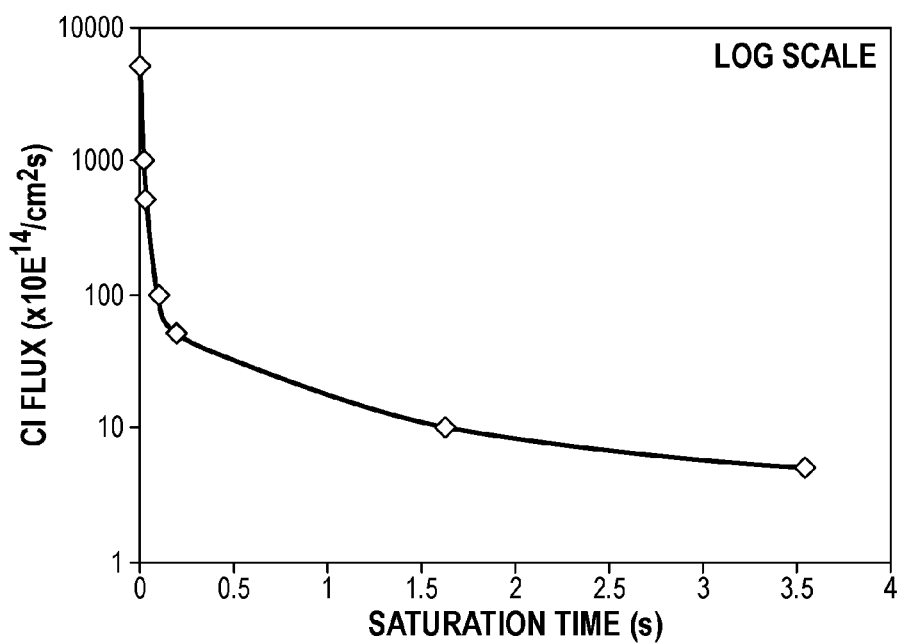
Figure 4E:
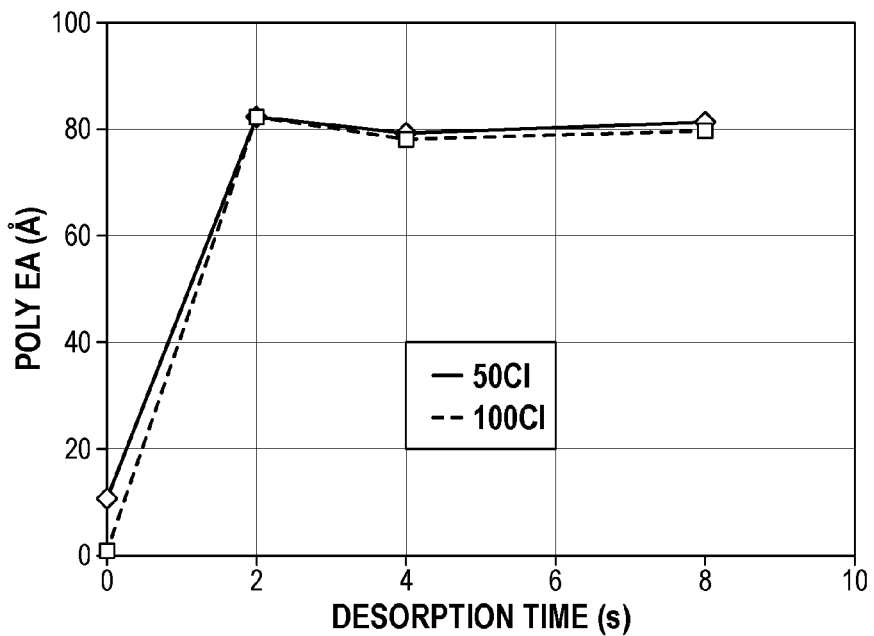
Figure 4F:
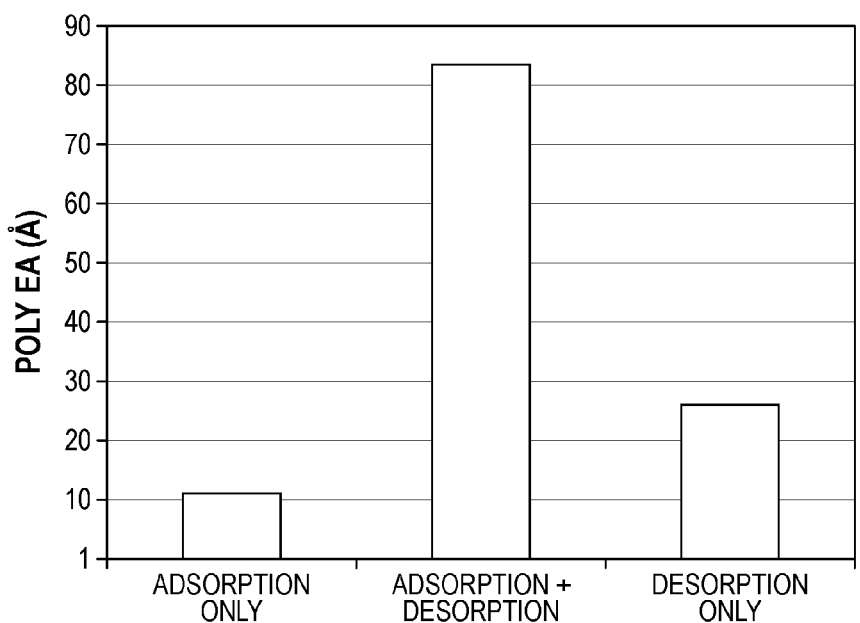

Table 1 provides parameters of an exemplary process, the results of which are presented in FIG. 4E. The pressure, temperature, flow rates and composition, source and bias powers, RDC, etc. can all be varied in alternative examples. The RDC value refers to a gas flow distribution parameter for the introduction of the etchant and reactant gas. In some embodiments, the gas distribution system may include a center gas distribution zone and an edge gas distribution zone. The value of the RDC parameter indicates the relative amount of gas flow distributed to the center and edge gas distribution zones. When RDC=50, the gas flow coupled to the edge gas distribution zone is equal to the gas flow coupled to the center gas distribution zone, and when RDC=5, 95% of the gas flow is coupled to the center gas distribution zone. The RDC value is not limited in the present invention, and can vary, for example, from 5 (5/95) to 20 (20/80), or greater.

pumping system 550. Plasma can be utilized to create materials specific to a pre-determined materials process, and/or to aid the removal of material from the exposed surfaces of substrate 525. The plasma processing system 500 can be configured to process substrates of any desired size, such as 200 mm substrates, 300 mm substrates, or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525. The heating system or cooling system may comprise a re-circulating flow of heat transfer fluid that receives heat from substrate holder 520 and transfers heat to a heat exchanger system (not shown) when cooling, or transfers

TABLE 1

| Step | Press. [mTorr] | Source Power [W] | Bias Power [W] | Gas flow [sccm] | | | Temp. [° C.] | | | Time [s] | Dyn. Proc.[4] |
| --- | --- | --- | --- | --- | --- | --- | --- | --- | --- | --- | --- |
| | | | | $Cl_2$ | Ar | RDC | $C^1$ | $E^2$ | Chill.[3] | | |
| Adsorption | 60 | 0 | 10 | 50, 100 | 100 | 5 | 30 | 30 | 10 | 2 | 30 |
| Desorption | 60 | 2500 | 150 | 0 | 1000 | 5 | 30 | 30 | 10 | $V^5$ | |

[1]At electrode center
[2]At electrode edge
[3]Cooling system temperature
[4]Total number of adsorption/desorption cycles
[5]Variable (see, e.g., FIG. 4E)

As suggested above and as shown in, the example provided in Table 1, halogenation ("adsorption") occurs quickly, i.e. in less than 2 seconds, when the radical flux is elevated greater than the ion flux. Without intending to be bound by any particular theory, it is believed that the surface saturates with SiCl (when etching Si) at an increasing rate with increasing Cl-radical flux relative to ion flux. Additionally, the data presented in FIG. 4E show that the desorption cycle may plateau under certain conditions, such that minimal further etching may take place after a certain period of time, even with continued desorption gas flow. For instance, in the results presented in FIG. 4E, the etch amount plateaus after a 2 second desorption time. Such a result suggests that it is possible to minimize expenditure of desorption gas and optimize the time required for the method. In other words, the desorption cycle is self-limiting.

The method of etching a layer on a substrate according to various embodiments described above may be performed in any one of the plasma processing systems illustrated in FIGS. 5 through 11 and described below. However, the methods discussed are not to be limited in scope by this exemplary presentation.

Figure 5:
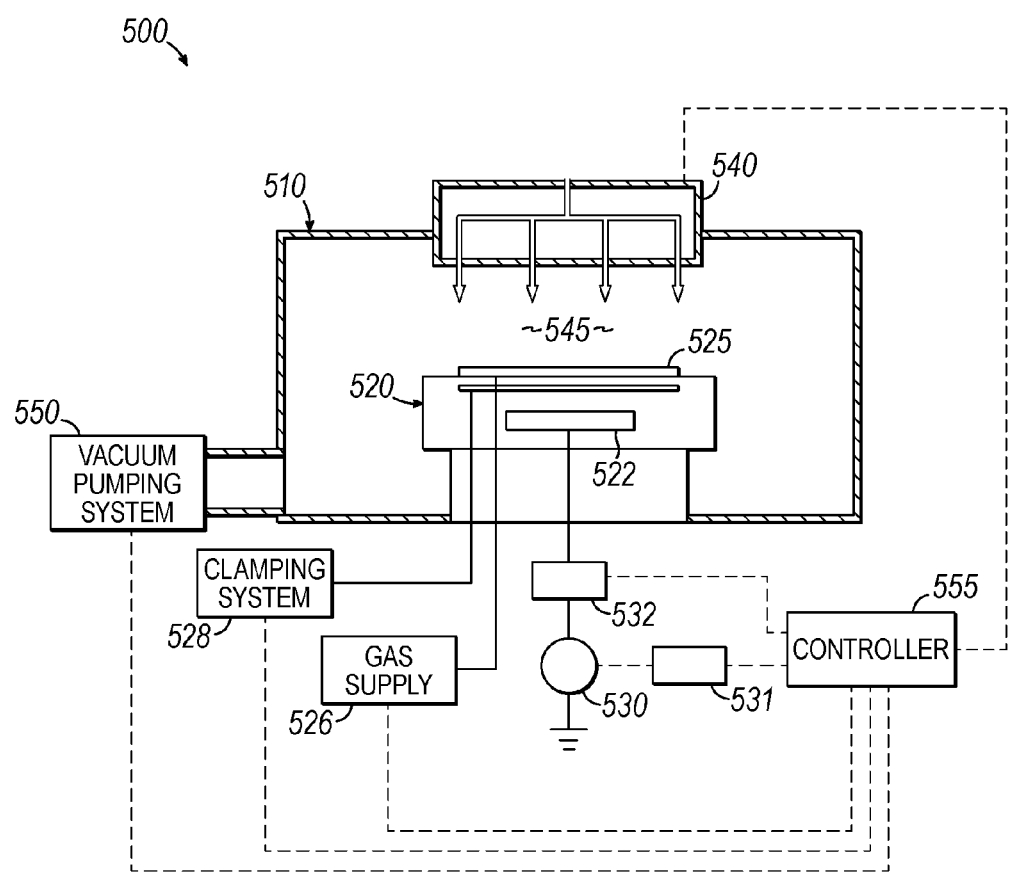
FIG. 5 shows a schematic representation of a plasma processing system according to an embodiment.

According to one embodiment depicted in FIG. 5, a plasma processing system 500 configured to perform the above identified process conditions includes a plasma processing chamber 510, substrate holder 520 on which is affixed a substrate 525 to be processed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550.

heat from the heat exchanger system to substrate holder 520 when heating. In other embodiments, heating/cooling elements, such as resistive heating elements, or thermo-electric heaters/coolers can be included in the substrate holder 520, as well as the chamber wall of the plasma processing chamber 510 and any other component within the plasma processing system 500.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein a helium gas-gap pressure can be independently varied between the center and the edge of substrate 525.

In the embodiment shown in FIG. 5, substrate holder 520 can comprise an electrode 522 through which RF power is coupled to the processing plasma in plasma processing region 545. For example, substrate holder 520 can be electrically biased at an RF voltage via the transmission of RF power from an RF generator 530 through an optional impedance match network 532 to substrate holder 520. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. Various RF systems for plasma processing are known and will not be discussed further.

Furthermore, the electrical bias of electrode 522 at an RF voltage may be pulsed using pulsed bias signal controller 531. The RF power output from the RF generator 530 may be pulsed between an off-state and an on-state, for example.

Alternately, RF power is applied to the substrate holder electrode at multiple frequencies. Furthermore, impedance match network 532 can improve the transfer of RF power to plasma in plasma processing chamber 510 by reducing the reflected power. Various match network topologies, such as L-type, π-type, T-type, etc and automatic control methods are known and may be used with the disclosed systems.

Gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Vacuum pumping system 550 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 liter per second to 3000 liter per second TMP can be employed. TMPs are useful for low pressure processing, e.g., less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 510.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, and the vacuum pumping system 550, as well as the substrate heating/cooling system (not shown), the backside gas supply system 526, and/or the electrostatic clamping system 528. For example, a program stored in the memory can be utilized to activate the inputs to the aforementioned components of plasma processing system 500 according to a process recipe in order to perform a plasma assisted process, such as a plasma etch process, on substrate 525.

Controller 555 can be located either locally or remotely relative to the plasma processing system 500. For example, controller 555 can exchange data with plasma processing system 500 using a direct connection, an intranet, and/or the internet. Controller 555 can be coupled to an intranet at, for example, a customer site (i.e., a device maker, etc.), or it can be coupled to an intranet at, for example, a vendor site (i.e., an equipment manufacturer). Alternatively or additionally, controller 555 can be coupled to the internet. Furthermore, another computer (i.e., controller, server, etc.) can access controller 555 to exchange data via a direct connection, an intranet, and/or the internet.

In the embodiment shown in FIG. 6, plasma processing system 600 can be similar to the embodiment of FIG. 5 and further comprise, in addition to those components described with reference to FIG. 5, either a stationary or mechanically- or electrically-rotating magnetic field system 660, in order to potentially increase plasma density and/or improve plasma processing uniformity. Moreover, controller 555 can be coupled to magnetic field system 660 in order to regulate the speed of rotation and field strength. The design and implementation of a rotating magnetic field is known and will not be discussed further.

Figure 6:
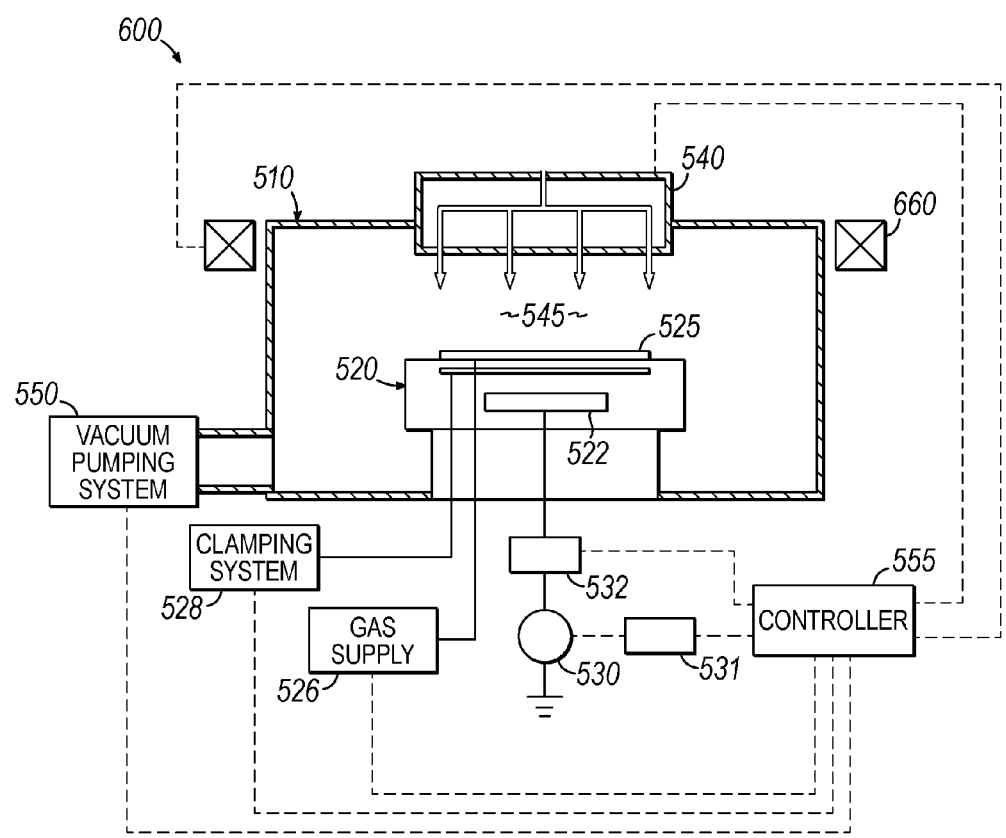
FIG. 6 shows a schematic representation of a plasma processing system according to another embodiment.
Figure 7:
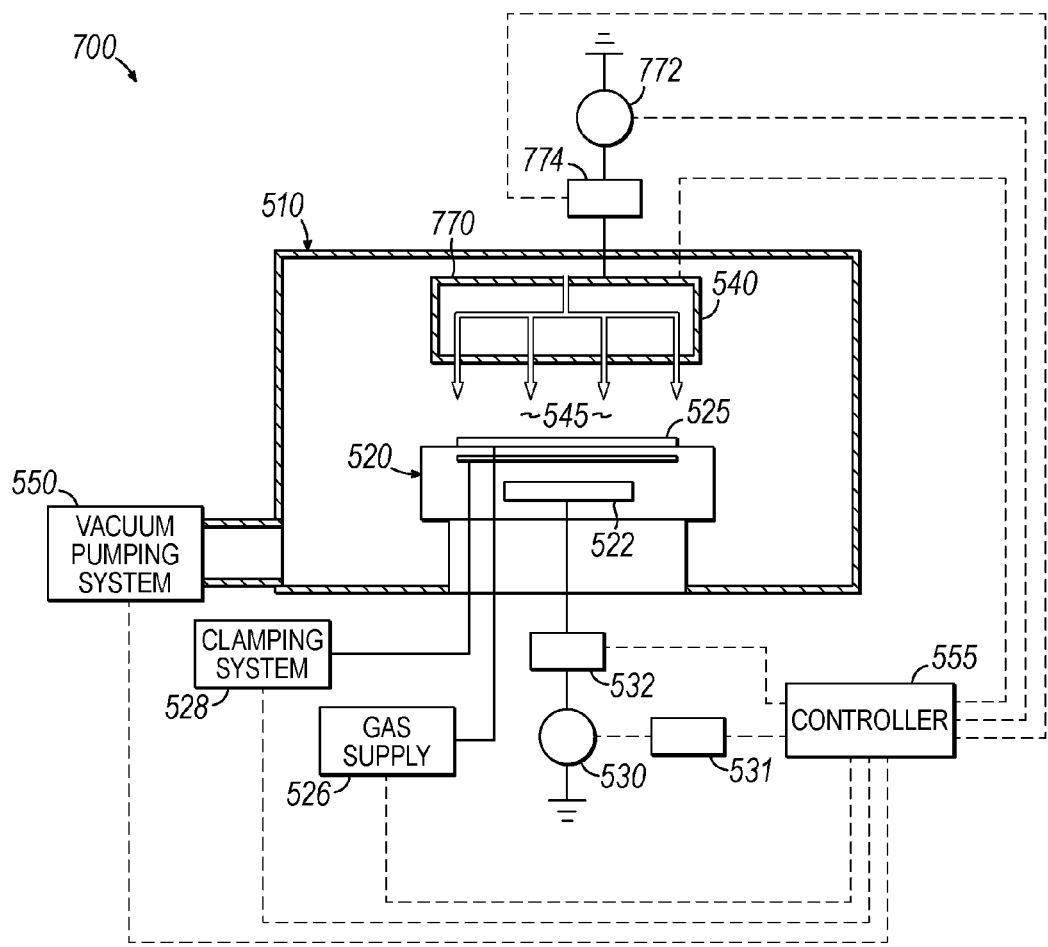
FIG. 7 shows a schematic representation of a plasma processing system according to another embodiment.

In the embodiment shown in FIG. 7, plasma processing system 700 can be similar to the embodiment of FIG. 5 or FIG. 6, and can further comprise an upper electrode 770 to which RF power can be coupled from RF generator 772 through optional impedance match network 774. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 772 and impedance match network 774 in order to control the application of RF power to upper electrode 770. The design and implementation of an upper electrode is known and will not be discussed further. The upper electrode 770 and the gas distribution system 540 can be designed within the same chamber assembly, as shown. Alternatively, upper electrode 770 may comprise a multi-zone electrode design for adjusting the RF power distribution coupled to plasma above substrate 525. For example, the upper electrode 770 may be segmented into a center electrode and an edge electrode. The embodiment shown in FIG. 7 may be advantageously used, for example, to etch device layers that include SiARCs.

Figure 8:
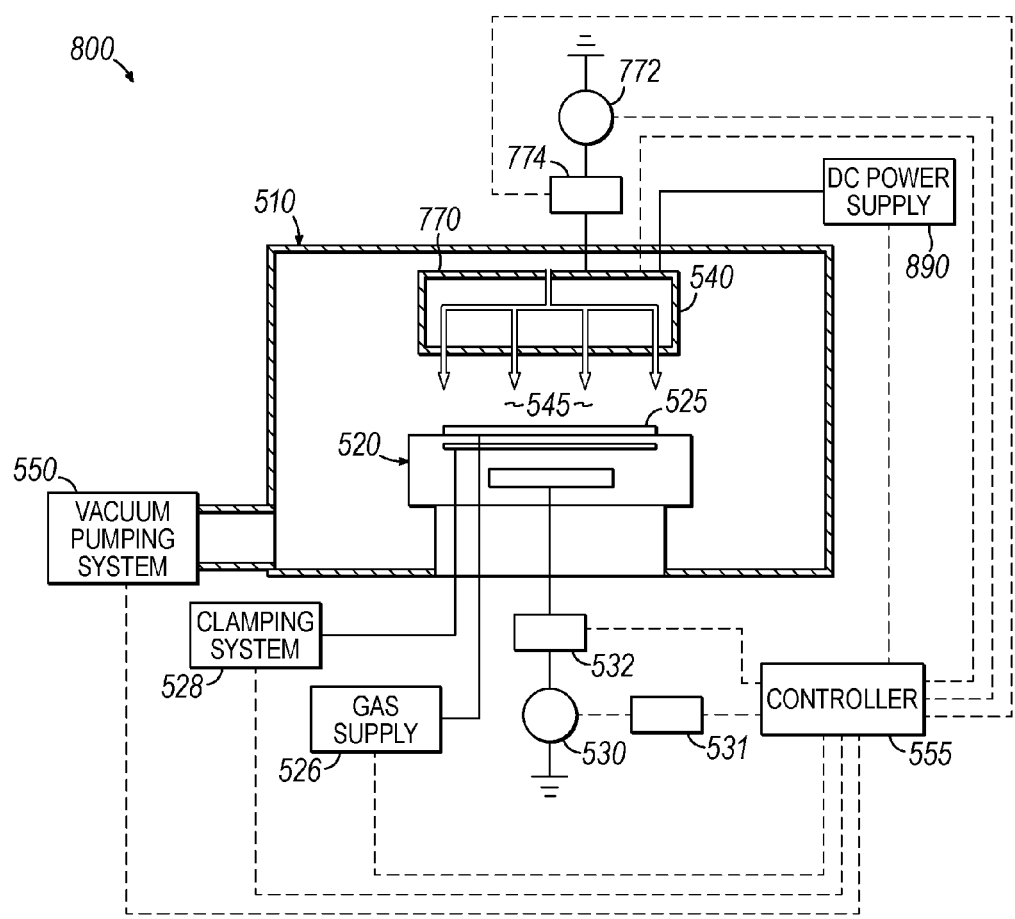
FIG. 8 shows a schematic representation of a plasma processing system according to another embodiment.

In the embodiment shown in FIG. 8, plasma processing system 800 can be similar to the embodiment of FIG. 7, and can further comprise a direct current (DC) power supply 890 coupled to the upper electrode 770 opposing substrate 525. The upper electrode 770 may comprise an electrode plate. The electrode plate may comprise a silicon-containing electrode plate. Moreover, the electrode plate may comprise a doped silicon electrode plate. The DC power supply 890 can include a variable DC power supply. Additionally, the DC power supply 890 can include a bipolar DC power supply. The DC power supply 890 can further include a system configured to perform at least one of monitoring, adjusting, or controlling the polarity, current, voltage, or on/off state of the DC power supply 890. Once plasma is formed, the DC power supply 890 facilitates the formation of a ballistic electron beam. An electrical filter (not shown) may be utilized to de-couple RF power from the DC power supply 890.

For example, the DC voltage applied to upper electrode 770 by DC power supply 890 may range from approximately −2000 volts (V) to approximately 1000 V. For instance, the absolute value of the DC voltage may have a value equal to or greater than approximately 100 V, or the absolute value of the DC voltage may have a value equal to or greater than approximately 500 V. As noted above, the DC voltage may have a negative polarity. For example, the DC voltage may be a negative voltage having an absolute value greater than the self-bias voltage generated on a surface of the upper electrode 770. The surface of the upper electrode 770 facing the substrate holder 520 may be comprised of a silicon-containing material.

Figure 9:
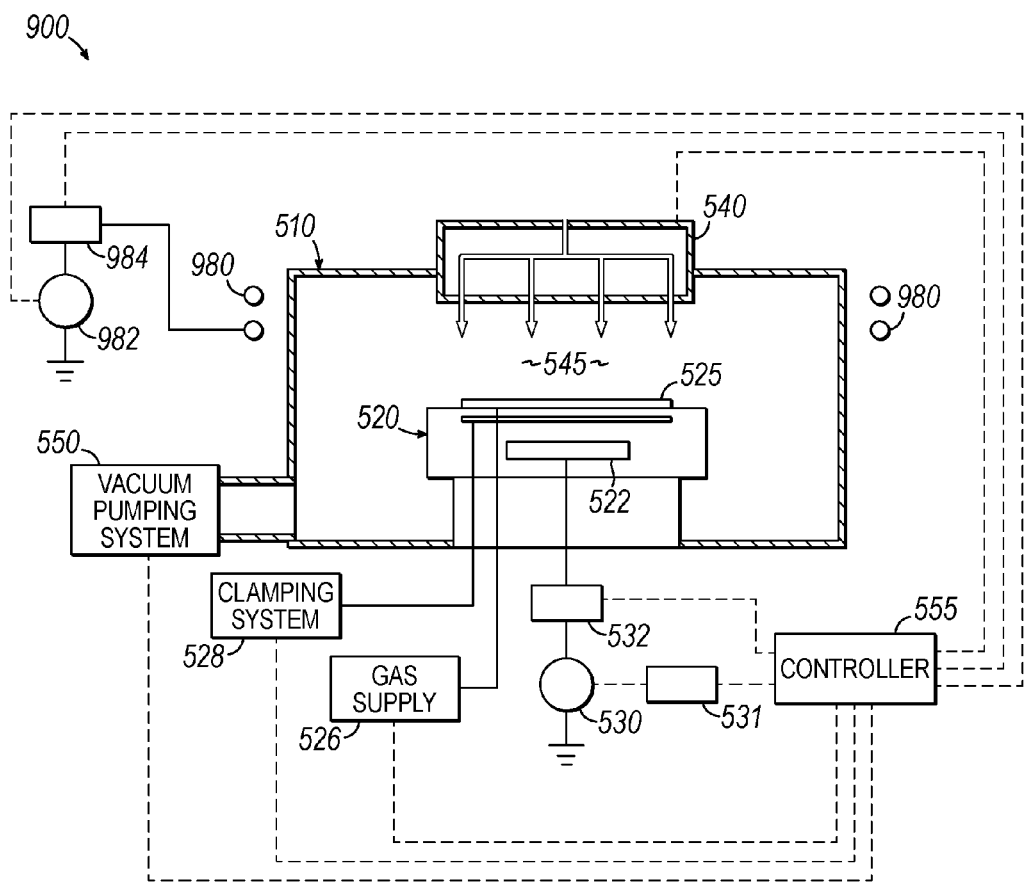
FIG. 9 shows a schematic representation of a plasma processing system according to another embodiment.

In the embodiment shown in FIG. 9, plasma processing system 900 can be similar to the embodiments of FIGS. 5 and 6, and can further comprise an inductive coil 980 to which RF power is coupled via RF generator 982 through optional impedance match network 984. RF power is inductively coupled from inductive coil 980 through a dielectric window (not shown) to plasma processing region 545. A frequency for the application of RF power to the inductive coil 980 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 980 and plasma in the plasma processing region 545. Moreover, controller 555 can be coupled to RF generator 982 and impedance match network 984 in order to control the application of power to inductive coil 980.

Figure 10:
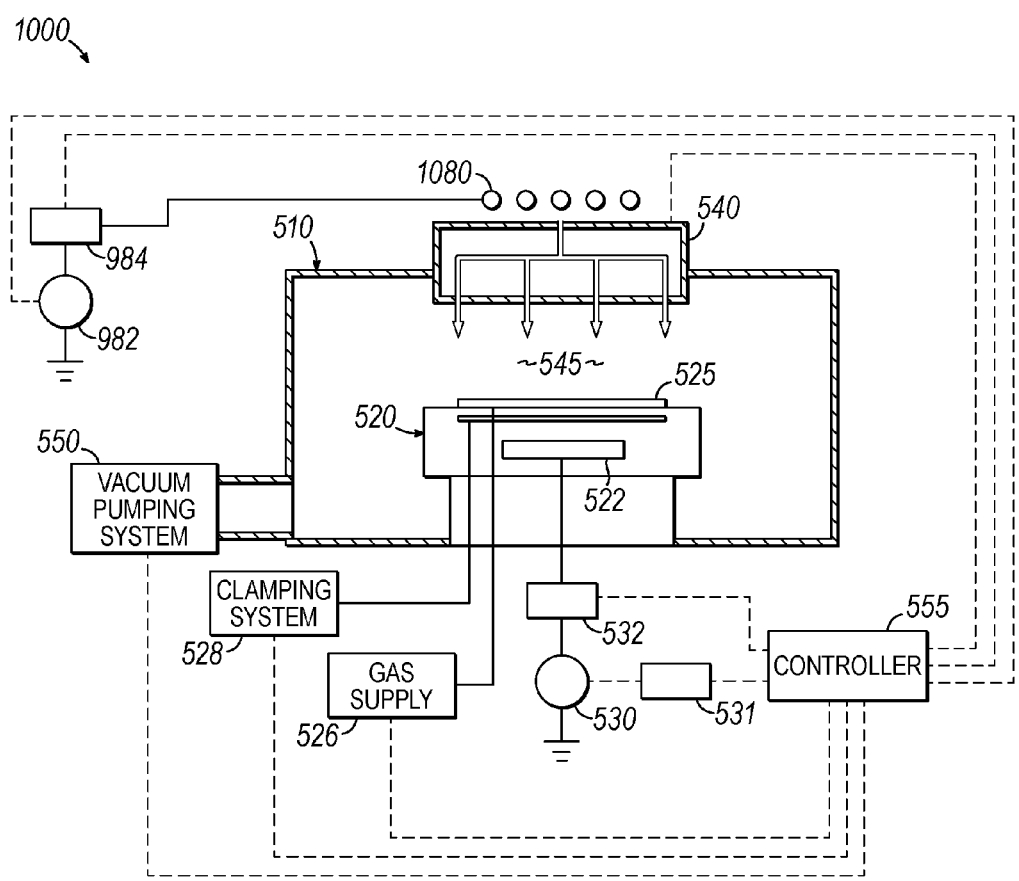
FIG. 10 shows a schematic representation of a plasma processing system according to another embodiment.

In an alternate embodiment, as shown in FIG. 10, plasma processing system 1000 can be similar to the embodiment of FIG. 9, and can further comprise an inductive coil 1080 that is a "spiral" coil or "pancake" coil in communication with the plasma processing region 545 from above, as in a transformer coupled plasma (TCP) reactor. The design and implementation of an inductively coupled plasma (ICP) source or transformer coupled plasma (TCP) source is known and will not be discussed further.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is known and will not be discussed further.

Figure 11:
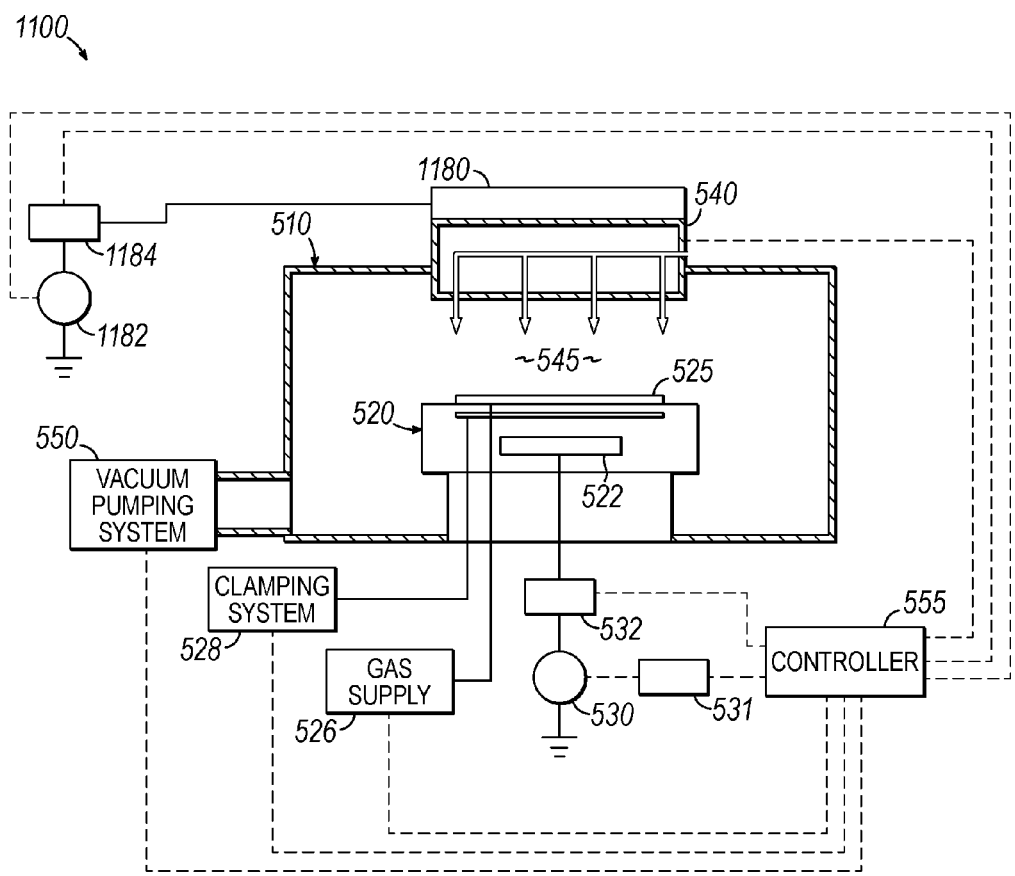
FIG. 11 shows a schematic representation of a plasma processing system according to another embodiment.

In the embodiment shown in FIG. 11, plasma processing system 1100 can be similar to the embodiment of FIG. 5, and can further comprise a surface wave plasma (SWP) source 1180. The SWP source 1180 can comprise a slot antenna, such as a radial line slot antenna, to which microwave power is coupled via microwave generator 1182 through optional impedance match network 1184.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of etching a substrate, comprising:
    disposing the substrate in a plasma processing system configured to facilitate an etching process;
    performing an atomic layer etching process cycle to etch a monolayer of an exposed surface of the substrate, the process cycle sequentially comprising:
        forming an adsorption monolayer comprising an etchant on the exposed surface of the substrate by introducing the etchant while concurrently coupling electromagnetic power to the plasma processing system at an applied power level targeted to achieve an etchant radical flux at the exposed surface greater than a total ion flux at the exposed surface,
        purging the plasma processing system to remove any excess etchant,
        desorbing the adsorption monolayer comprising the etchant by exposing the adsorption monolayer to gas ions to activate a reaction of the etchant, and
        purging the plasma processing system to remove the desorbed adsorption monolayer; and
    repeating the atomic layer etching process cycle until a target etch depth is reached wherein each process cycle etches the monolayer from the exposed surface,
    wherein the applied power level is less than or equal to 50 W.

2. The method of claim 1, wherein the applied power level is less than or equal to 10 W.

3. The method of claim 1, wherein the electromagnetic power is coupled to the plasma processing system at least in part as bias power coupled to a substrate holder upon which the substrate rests.

4. The method of claim 3, wherein the electromagnetic power is exclusively applied as bias power to the substrate holder.

5. The method of claim 3, wherein additional electromagnetic power is coupled to the plasma processing system as source power to an electrode opposing and facing the substrate holder.

6. The method of claim 1, wherein the electromagnetic power is coupled to the plasma processing system at least in part as source power coupled to an electrode opposing and facing a substrate holder upon which the substrate rests.

7. The method of claim 6, wherein the electromagnetic power is exclusively applied as source power to the electrode opposite the substrate holder.

8. The method of claim 1, wherein the etchant includes a halogen element.

9. The method of claim 8, wherein the etchant includes a halide, a halomethane, a halosilane, or a combination of two or more thereof.

10. The method of claim 8, wherein the etchant includes $Cl_2$, $Br_2$, $F_2$, HBr, $BCl_3$, $SF_6$, $NF_3$, a fluorocarbon compound of the form $C_xF_y$ wherein x and y are real numbers greater than zero, a fluorohydrocarbon compound of the form $C_xF_yH_z$ wherein x, y and z are real numbers greater than zero, or any combination of two or more thereof.

11. The method of claim 1, wherein the power level is targeted to achieve a ratio of the etchant radical flux to the total ion flux at the substrate that exceeds a value of 100.

12. The method of claim 1, wherein the power level is targeted to achieve a ratio of the etchant radical flux to the total ion flux at the substrate that exceeds a value of 1000.

13. The method of claim 1, wherein forming the adsorption monolayer proceeds for less than or equal to 2 seconds per process cycle.

14. The method of claim 1, wherein forming the adsorption monolayer proceeds for less than or equal to 0.5 second per process cycle.

15. The method of claim 1, wherein the exposed surface of the substrate includes silicon, the etchant includes $Cl_2$, and the gas ions include Ar ions.

16. A method of etching a substrate, comprising:
    disposing the substrate in a plasma processing system configured to facilitate an etching process;
    etching an exposed surface of the substrate one monolayer of substrate material per process cycle, wherein each process cycle comprises alternatingly performing an adsorption step and a desorption step,
    wherein the adsorption step includes adsorbing an etchant on the exposed surface of the substrate while coupling electromagnetic power to the plasma processing system at an applied power level less than or equal to 50 W to achieve an etchant radical flux at the exposed surface greater than a total ion flux at the exposed surface, and
    wherein the desorption step includes activating a reaction between the adsorbed etchant and the monolayer of substrate material to desorb a reaction product.

17. The method of claim 16, wherein the desorption step includes coupling electromagnetic power to the plasma processing system as bias power coupled to a substrate holder upon which the substrate rests and as source power coupled to an electrode opposing and facing the substrate holder while flowing a noble gas into the plasma processing system to form gas ions having an energy sufficient to activate the reaction.

18. The method of claim 16, further comprising purging the plasma processing system between the adsorption step and the desorption step and after the desorption step.

19. The method of claim 16, wherein the applied power level is less than or equal to 20 W.

20. The method of claim 16, wherein the applied power level is adjusted to achieve a ratio of the etchant radical flux to the total ion flux at the substrate that exceeds a value of 100.

* * * * *